US012640450B2

(12) United States Patent
Cho et al.

(10) Patent No.: US 12,640,450 B2
(45) Date of Patent: May 26, 2026

(54) RECHARGEABLE BATTERY PACK

(71) Applicant: SAMSUNG SDI CO., LTD., Yongin-si (KR)

(72) Inventors: Hyun Cho, Yongin-si (KR); Woojin Lee, Yongin-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 256 days.

(21) Appl. No.: 18/232,634

(22) Filed: Aug. 10, 2023

(65) Prior Publication Data

US 2024/0170817 A1 May 23, 2024

(30) Foreign Application Priority Data

Nov. 23, 2022 (KR) ........................ 10-2022-0158665

(51) Int. Cl.
| | |
|---|---|
| *H01M 50/574* | (2021.01) |
| *H01M 50/105* | (2021.01) |
| *H01M 50/383* | (2021.01) |
| *H01M 50/595* | (2021.01) |
| *H05K 1/02* | (2006.01) |

(52) U.S. Cl.
CPC ....... *H01M 50/574* (2021.01); *H01M 50/105* (2021.01); *H01M 50/383* (2021.01); *H01M 50/595* (2021.01); *H05K 1/028* (2013.01)

(58) Field of Classification Search
CPC ............. H01M 50/574; H01M 50/105; H01M 50/383; H01M 50/595; H01M 2010/4271; H01M 50/178; H01M 50/55; H01M 50/557; H01M 10/425; H01M 50/284; H01M 50/59; H01M 50/519; H01M 50/588; H05K 1/028; H01R 4/70; H01R 12/62
See application file for complete search history.

(56) References Cited

U.S. PATENT DOCUMENTS

| | | | |
|---|---|---|---|
| 5,759,730 A * | 6/1998 | Hermansen | ............. C08L 63/00 |
| | | | 438/106 |
| 10,985,358 B2 * | 4/2021 | Wang | .................. H01M 50/533 |

(Continued)

FOREIGN PATENT DOCUMENTS

| | | |
|---|---|---|
| EP | 3843172 A1 | 6/2021 |
| KR | 10-1192042 B1 | 10/2012 |

(Continued)

OTHER PUBLICATIONS

European Search Report dated Feb. 8, 2024.
Korean Office action dated Apr. 3, 2025.

*Primary Examiner* — Michael L Dignan
(74) *Attorney, Agent, or Firm* — Lee IP Law, P.C.

(57) ABSTRACT

A rechargeable battery pack may include a battery cell configured to draw out an electrode tab from an electrode assembly accommodated in a pouch, a protection circuit module (PCM) connected to an electrode tab drawn out to a terrace of the pouch and connected to a printed circuit board (PCB) including a protection circuit through a flexible printed circuit board (FPCB). The rechargeable battery pack may include top tape configured to surround the protection circuit module and is attached to the battery cell to form a terrace space therein, and a flame retardant coated portion formed by coating a flame retardant coating agent on at least one portion of the protection circuit module exposed to an outside of the top tape.

16 Claims, 5 Drawing Sheets

(56)     References Cited

U.S. PATENT DOCUMENTS

| | | | |
|---|---|---|---|
| 11,217,830 B2 * | 1/2022 | Lee ..................... | H01M 50/287 |
| 11,375,623 B2 * | 6/2022 | Na ......................... | H05K 3/341 |
| 2005/0176310 A1 * | 8/2005 | Kataoka ................. | H05K 3/363 |
| | | | 439/876 |
| 2006/0214632 A1 | 9/2006 | Lee et al. | |
| 2012/0106015 A1 | 5/2012 | Kwak et al. | |
| 2013/0101871 A1 * | 4/2013 | Byun ................. | H01M 10/425 |
| | | | 361/783 |
| 2013/0149562 A1 | 6/2013 | Lee et al. | |
| 2016/0218347 A1 | 7/2016 | Baek et al. | |
| 2020/0099106 A1 | 3/2020 | Lee | |
| 2020/0274204 A1 * | 8/2020 | Dawley ............... | H01M 50/507 |
| 2022/0011817 A1 * | 1/2022 | Kim ................... | H04M 1/0262 |
| 2022/0272836 A1 * | 8/2022 | Uchita ................. | H05K 1/0256 |
| 2022/0287178 A1 * | 9/2022 | Takahashi ............. | H05K 1/118 |
| 2024/0204302 A1 * | 6/2024 | Oh ...................... | H01M 10/655 |

FOREIGN PATENT DOCUMENTS

| | | | | | |
|---|---|---|---|---|---|
| KR | 10-2016-0092749 A | | 8/2016 | | |
| KR | 20160092749 A | * | 8/2016 | ......... | H01M 50/531 |
| KR | 10-2017-0056928 A | | 5/2017 | | |
| KR | 10-2017-0094646 A | | 8/2017 | | |
| KR | 20170094646 A | * | 8/2017 | ............. | H01M 2/30 |
| KR | 10-2019-0140581 A | | 12/2019 | | |
| KR | 20190140581 A | * | 12/2019 | ......... | H01M 50/202 |
| KR | 102331065 B1 | * | 11/2021 | ......... | H01M 50/287 |

* cited by examiner

RECHARGEABLE BATTERY PACK

CROSS-REFERENCE TO RELATED APPLICATION

Korean Patent Application No. 10-2022-0158665, filed on Nov. 23, 2022, in the Korean Intellectual Property Office, is incorporated herein by reference.

BACKGROUND OF THE INVENTION

1. Field

The present disclosure relates to a rechargeable battery pack, and more particularly, to a rechargeable battery pack that implements nonflammablility for a connection portion between a printed circuit board and a flexible printed circuit board in a protection circuit module.

2. Description of the Related Art

A rechargeable battery can be repeatedly charged and discharged, unlike a primary battery. A low-capacity rechargeable battery is used for small portable electronic devices such as a mobile phone, a notebook computer, and a camcorder, and a large-capacity rechargeable battery is used as a power supply for driving a motor such as for a hybrid car.

SUMMARY

Embodiments are directed to a rechargeable battery pack. The rechargeable battery pack may include a battery cell configured to draw out an electrode tab from an electrode assembly accommodated in a pouch, a protection circuit module (PCM) connected to an electrode tab drawn out to a terrace of the pouch and connected to a printed circuit board (PCB) including a protection circuit through a flexible printed circuit board (FPCB), and a top tape configured to surround the protection circuit module and that is attached to the battery cell to form a terrace space therein. A flame retardant coated portion formed by coating a flame retardant coating agent on at least one portion of the protection circuit module may be exposed to an outside of the top tape.

Embodiments are also directed to a rechargeable battery pack. The rechargeable battery pack may include a battery cell configured to draw out an electrode tab from an electrode assembly accommodated in a pouch, a protection circuit module (PCM) connected to an electrode tab drawn out to a terrace of the pouch and connected to a printed circuit board (PCB) including a protection circuit through a flexible printed circuit board (FPCB), and a top tape configured to surround the protection circuit module and that is attached to the battery cell to form a terrace space therein.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
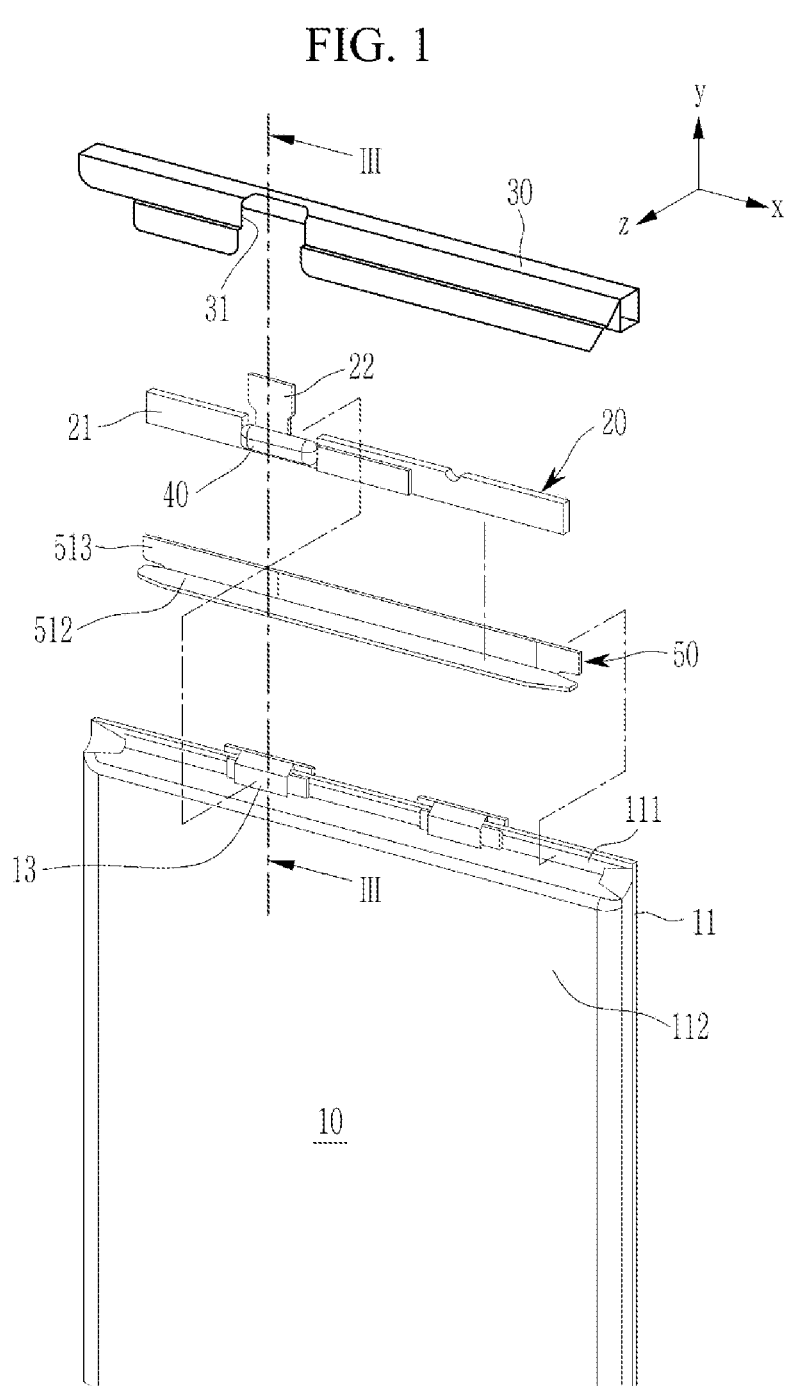
FIG. 1 illustrates an exploded perspective view of a rechargeable battery pack according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
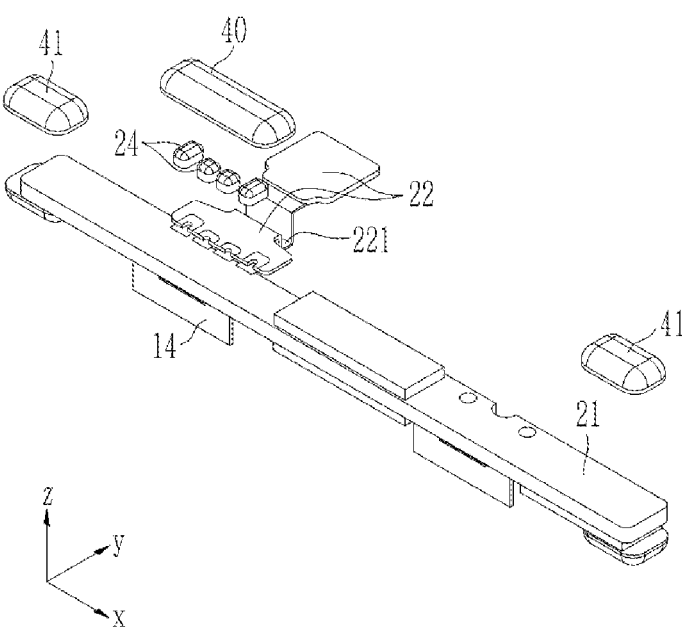
FIG. 2 illustrates an exploded perspective view of an example embodiment of a protection circuit module (PCM) of FIG. 1, in which a flexible printed circuit board (FPCB) is drawn out from a printed circuit board (PCB) to a front.

FIG. 1 illustrates an exploded perspective view of a rechargeable battery pack according to an example embodiment, and FIG. 2 illustrates an exploded perspective view of a protection circuit module (PCM) of FIG. 1, in which a flexible printed circuit board (FPCB) is drawn out from a printed circuit board (PCB) to a front.

Referring to FIG. 1 and FIG. 2, the rechargeable battery pack of the first embodiment may include an example embodiment of a battery cell 10, a protection circuit module (PCM) 20, a top tape 30, and a flame retardant coated portion 40.

Although described as a protection circuit module (PCM), a protection module package (PMP) having a resin mold on a printed circuit board (PCB) may also be included.

Figure 3:
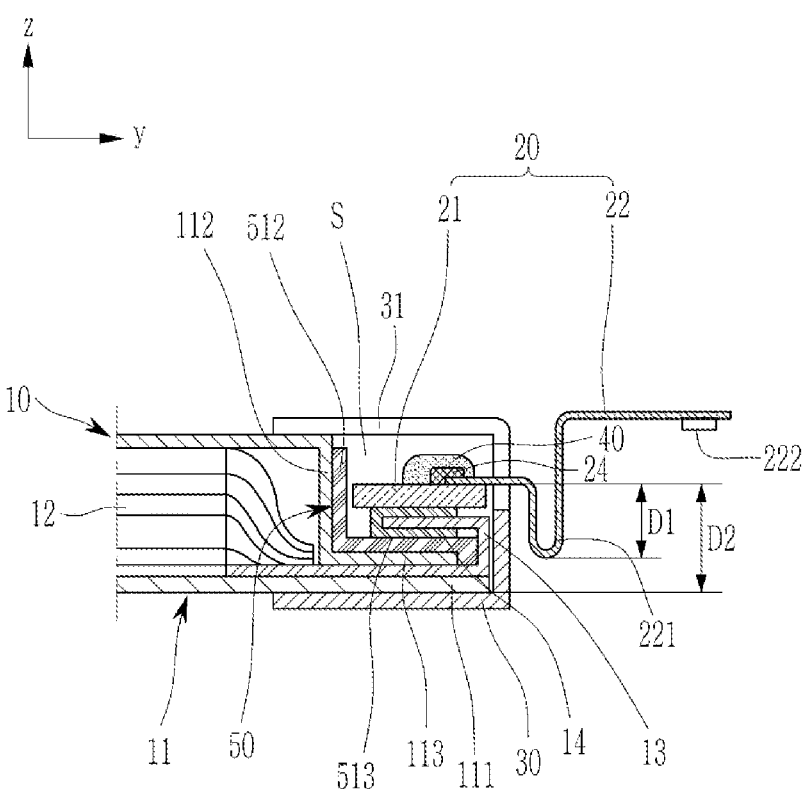
FIG. 3 illustrates a cross-sectional view of an example embodiment of the protection circuit module (PCM) of FIG. 1 taken along a line after being coupled.

FIG. 3 illustrates a cross-sectional view of an example embodiment of the protection circuit module (PCM) of FIG. 1 taken along a line after being coupled. Referring to FIG. 1 to FIG. 3, the battery cell 10 may be configured by drawing out an electrode tab 13 from an electrode assembly 12 accommodated in a pouch 11.

The electrode assembly 12 may include a first electrode (e.g., a negative electrode) and a second electrode (e.g., a positive electrode) provided at opposite sides of a separator that is an electrical insulating material, and may be formed by winding the negative electrode, the separator, and the positive electrode. The electrode assembly may be formed to have a stacked structure (not illustrated).

The negative electrode and the positive electrode may each include an electrode substrate of a metal foil (e.g., Cu, Al foil), that is, a coated portion in which an active material is applied to a current collector, and a plurality of non-coated region tabs formed of a current collector exposed by not applying an active material.

The uncoated region tabs may be stacked and connected to the electrode tab 13 to allow a current to be charged and discharged to and from the electrode assembly 12 to flow. Accordingly, the electrode assembly 12 may charge and discharge a high current through the electrode tab 13.

The protection circuit module 20 may be connected to the electrode tab 13 drawn out to a terrace 111 of the pouch 11 via a connection tab 14 (a nickel tab as an example). The protection circuit module 20 may include a printed circuit board (PCB) 21 having a protection circuit and a flexible printed circuit board (FPCB) 22 connected thereto. The flexible printed circuit board (FPCB) 22 may connect the protection circuit module 20 to a load.

The top tape 30 may surround the protection circuit module 20 to be attached to the battery cell 10 to form a space S of the terrace 111 therein. As an example, the top tape 30 may be attached to a first surface of the pouch 11 forming the terrace 111 and may be firstly bent, covering the space S of the terrace 111 to which the protection circuit module 20 is attached and may be secondly bent, and is attached to a second surface of the pouch 11.

The top tape 30 may expose a portion of the protection circuit module 20. That is, a portion of the protection circuit module 20 may be exposed to the outside of the top tape 30. The flame retardant coated portion 40 may be formed by coating a flame retardant coating agent on at least one of externally exposed portions of the top tape 30.

The rechargeable battery pack of the first embodiment may further include a protection tape 50. The protection tape 50 may be provided between the terrace 111 and the protection circuit module 20. That is, the terrace 111 may include a first side surface 112 of the pouch 11 accommodating the electrode assembly 12 and a first bottom 113 connected to the first side surface 112.

Accordingly, the protection tape 50 may include a second side surface 512 and a second bottom 513 bent and connected to the second side surface 512. The second side surface 512 and the second bottom 513 may be attached to correspond to the first side surface 112 and the first bottom 113, respectively.

The electrode tab 13 may be drawn out to an end of the first bottom 113 of the terrace 111 and bent to be positioned on the second bottom 513 of the protection tape 50 attached to the first bottom 113 of the space S of the terrace 111.

More specifically, the electrode tab 13 may be between upper and lower sides of the connection tab 14, which may be bent since the connection tab 14 may be bent when it is welded to the connection tab 14. Accordingly, the connection tab 14 and the electrode tab 13 are stacked between the printed circuit board 21 and the second bottom 513 of the protective tape 50. In this case, the connection tab 14 and the electrode tab 13 electrically and mechanically firmly maintain connection therebetween.

Referring to FIG. 1 and FIG. 3, the top tape 30 may form an opening 31 corresponding to a connection portion between the printed circuit board 21 and the flexible printed circuit board 22. That is, the opening 31 may enable draw-out of the flexible printed circuit board 22 connected to the printed circuit board 21.

The flame retardant coated portion 40 may be formed by coating a flame retardant coating agent on a connection portion positioned in the opening 31. The flexible printed circuit board 22 may be connected to the printed circuit board 21 by a soldering part 24. The flame retardant coated portion 40 may cover the soldering part 24 and an end portion of the flexible printed circuit board 22 on the printed circuit board 21.

As an example, the soldering part 24 may be provided in a plurality along a length direction (x-axis direction) of the printed circuit board 21 to connect the flexible printed circuit board 22 to the printed circuit board 21 at a plurality of points. The flame retardant coated portion 40 may be formed long in a longitudinal direction (x-axis direction) to perform flame retardant coating to the plurality of soldering parts 24.

A flame retardant coated portion 41 may further perform the flame retardant coating on opposite ends of the printed circuit board 21 at opposite ends in the longitudinal direction (x-axis direction). As an example, the flame retardant coated portion 41 may integrally perform the flame retardant coating on upper and lower surfaces of the printed circuit board 21 at the opposite ends in the longitudinal direction (x-axis direction).

As an example, the flame retardant coated portions 40 and 41 may have a thickness of 20 to 110 When the thickness is smaller than 20 it may be difficult to obtain the required flame retardant performance, and when the thickness exceeds 110 μm, a flame retardant may be excessively used compared to improvement of the flame retardant performance.

Referring back to FIG. 1 to FIG. 3, the flexible printed circuit board 22 may connect the printed circuit board 21 to a load (not illustrated), which may have a bending portion 221 therebetween, and may absorb a change in length and shock or vibration between the printed circuit board 21 and the load to block transmission of impact or vibration from the load to the printed circuit board 21.

As an example, the bending portion 221 may be formed to have a U-shape or V-shape. A depth D1 of the bending portion 221 may be set to a size equal to or smaller than a distance D2 between the printed circuit board 21 and an outer surface of the terrace 111. The distance D2 may even include a thickness of an outer surface of the top tape 30.

Specifically, the flexible printed circuit board 22 may include a connector 222 connected to the load. The bending portion 221 may be provided between the printed circuit board 21 and the connector 222 to prevent transfer of vibration and impact from the connector 222 to the printed circuit board 21.

The flexible printed circuit board 22 may be connected in a width direction (y-axis direction) of the printed circuit board 21 at a predetermined position between opposite ends of the printed circuit board 21 in a longitudinal direction (x-axis direction). That is, the flexible printed circuit board 22 may be drawn out to a front of the printed circuit board 21 or the battery cell 10.

Another embodiment of the present disclosure will be described below. For convenience, compared to the first embodiment, a description of the same components will be omitted and different components will be described.

Figure 4:
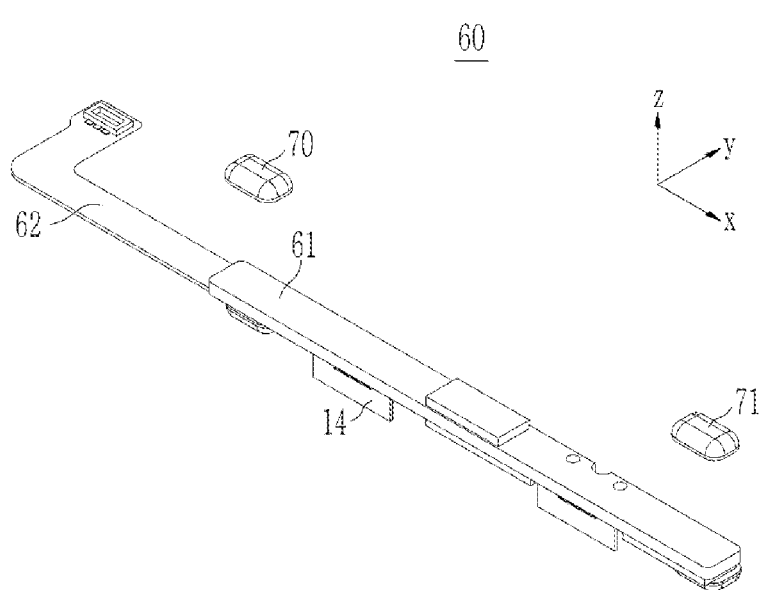
FIG. 4 illustrates a perspective view from above showing an example embodiment of a protection circuit module (PCM) in a rechargeable battery pack, in which a flexible printed circuit board (FPCB) is drawn out from a printed circuit board (PCB) to a side.
Figure 5:
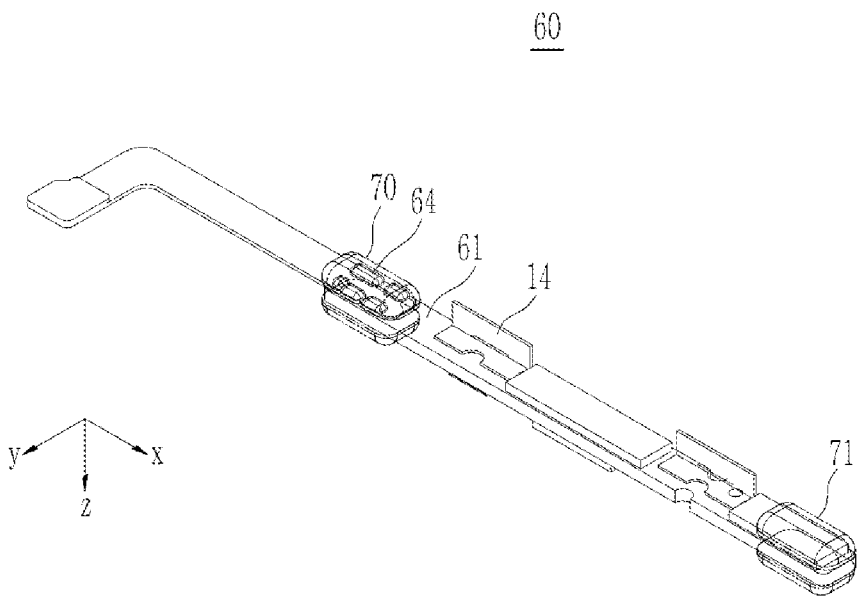
FIG. 5 illustrates a perspective view of FIG. 4 seen from below.

FIG. 4 illustrates a perspective view from above showing an example embodiment of a protection circuit module (PCM) in a rechargeable battery pack, in which a flexible printed circuit board (FPCB) is drawn out from a printed circuit board (PCB) to a side, and FIG. 5 illustrates a perspective view of FIG. 4 seen from below.

Referring to FIG. 4 and FIG. 5, in the protection circuit module 60, the flexible printed circuit board 62 may be connected in the longitudinal direction (x-axis direction) of the printed circuit board 61 at one side of opposite ends of the printed circuit board 61 in the longitudinal direction (x-axis direction).

The flame retardant coated portion 70 may cover an end portion of the flexible printed circuit board 62 positioned on the printed circuit board 61, and a soldering part 64 connecting the printed circuit board 61 and the flexible printed circuit board 62. That is, the flame retardant coated portion 70 may integrally perform the flame retardant coating on upper and lower surfaces of the printed circuit board 61 at a first end in the longitudinal direction (x-axis direction).

Opposite ends of the flame retardant coated portion 71 may be flame retardant coated at a second end in the longitudinal direction (x-axis direction). As an example, the flame retardant coated portion 71 may integrally perform the flame retardant coating on upper and lower surfaces of the printed circuit board 61 at a first end in the longitudinal direction (x-axis direction).

By way of summary and review, a rechargeable battery includes an electrode assembly for charging and discharging, a case accommodating the electrode assembly and an electrolyte solution, a cap plate coupled to an opening of the case, and an electrode terminal that is electrically connected to the electrode assembly to draw out the electrode assembly to the outside of the cap plate.

A rechargeable battery pack is formed by providing a protection circuit module (PCM) to an electrode terminal of the rechargeable battery. A connection portion between a printed circuit board (PCB) and a flexible printed circuit board (FPCB) in the protection circuit module (PCM) of the rechargeable battery pack is drawn out through a cut portion of a top tape. Accordingly, the connection portion between the printed circuit board and the flexible printed circuit board is exposed without being covered by the top tape.

Since a customer requires nonflammablility for the exposed connection portion, a flame retardant tape is used to cover the connection portion. As for a flame retardant tape, when the flexible printed circuit board is drawn out from a side, it is possible to secure nonflammablility with a smooth finish.

However, when the flexible printed circuit board is drawn out from a front, an exposed portion inevitably occurs in the middle of the protection circuit module due to the structure of a pouch pack, so there is bending on the flexible printed circuit board, and the flame retardant tape becomes unable to finish covering the exposed portion. That is, when it is drawn out from the front, the flame retardant tape becomes unable to secure complete nonflammablility for the exposed portion.

An embodiment of the present disclosure has been made in an effort to provide a rechargeable battery pack implementing nonflammablility for a connection portion between a printed circuit board and a flexible printed circuit board in a protection circuit module.

An embodiment of the present disclosure has been made in an effort to provide a rechargeable battery pack ensuring nonflammablility at a connection portion by covering the connection portion even when a flexible printed circuit board (FPCB) is drawn out from the printed circuit board (PCB) of the protection circuit module (PCM) to the front or side.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A rechargeable battery pack comprising:
a battery cell configured to draw out an electrode tab from an electrode assembly accommodated in a pouch;
a protection circuit module connected to an electrode tab drawn out to a terrace of the pouch and connected to a printed circuit board including a protection circuit through a connection tab;
a top tape configured to surround the protection circuit module and is attached to the battery cell to form a terrace space therein;
a flame retardant coated portion formed by coating a flame retardant coating agent on at least one portion of the protection circuit module exposed to an outside of the top tape, wherein the flame retardant coated portion encapsulates a soldering part connecting the printed circuit board and a flexible printed circuit board and an end portion of the flexible printed circuit board on the printed circuit board; and
a protection tape provided between the terrace and the protection circuit module, wherein the protection tape is folded in a direction away from the printed circuit board to cover an edge of the pouch above the terrace.

2. The rechargeable battery pack as claimed in claim 1, wherein the top tape
is attached to a first surface of the pouch forming the terrace and is firstly bent,
covers the terrace space to which the protection circuit module is attached and is secondly bent, and
is attached to a second surface of the pouch.

3. The rechargeable battery pack as claimed in claim 1, wherein:
the terrace includes a first side surface of the pouch accommodating an electrode assembly and a first bottom connected to the first side surface, and
the protection tape includes a second side surface and a second bottom connected to the second side surface to be attached to correspond to the first side surface and the first bottom surface.

4. The rechargeable battery pack as claimed in claim 3, wherein the electrode tab is drawn out and bent to an end of the first bottom of the terrace to be positioned on the second bottom of the protection tape attached to the first bottom of the terrace space.

5. The rechargeable battery pack as claimed in claim 1, wherein
the electrode tab is drawn out and bent to an end of the first bottom of the terrace to be positioned on the first bottom of the terrace space, and
the printed circuit board is connected to the electrode tab via the connection tab.

6. The rechargeable battery pack as claimed in claim 5, wherein
the top tape forms an opening corresponding to a connection portion between the printed circuit board and a flexible printed circuit board, and
the flame retardant coated portion
is formed by coating a flame retardant coating on the connection portion positioned in the opening.

7. The rechargeable battery pack as claimed in claim 6, wherein
the flexible printed circuit board includes a connector connected to a load, and
a bending portion between the printed circuit board and the connector.

8. The rechargeable battery pack as claimed in claim 6, wherein the flexible printed circuit board is connected in a width direction of the printed circuit board at a predetermined position between opposite ends of the printed circuit board in a longitudinal direction.

9. The rechargeable battery pack as claimed in claim 6, wherein the soldering part is provided in a plurality along a length direction of the printed circuit board, and the flame retardant coated portion is formed long in a longitudinal direction by coating the flame retardant coating agent on a plurality of soldering parts.

10. The rechargeable battery pack as claimed in claim 6, wherein the flame retardant coating agent is further coated on opposite ends of the printed circuit board at opposite ends in the longitudinal direction.

11. The rechargeable battery pack as claimed in claim 10, wherein the flame retardant coating agent is further coated on upper and lower surfaces of the printed circuit board at opposite ends in the longitudinal direction.

12. The rechargeable battery pack as claimed in claim 4, wherein the flame retardant coating portion has a thickness of 20 to 110 μm.

13. The rechargeable battery pack as claimed in claim 7, wherein a depth of the bending portion is set to a size that is smaller than or equal to a distance between the printed circuit board and an outer surface of the first bottom.

14. The rechargeable battery pack as claimed in claim 13, wherein the bending portion is formed to have a U-shape or V-shape.

15. The rechargeable battery pack as claimed in claim 6, wherein the flexible printed circuit board is connected in a longitudinal direction of the printed circuit board at one side of opposite ends of the printed circuit board in the longitudinal direction.

16. The rechargeable battery pack as claimed in claim 15, wherein the flame retardant coated portion is coated with the flame retardant coating agent on upper and lower surfaces of the printed circuit board at opposite ends in the longitudinal direction.

* * * * *